United States Patent
Xu (10) Patent No.: US 12,133,398 B2
(45) Date of Patent: Oct. 29, 2024

(54) TANDEM CELL

(71) Applicant: LONGI GREEN ENERGY TECHNOLOGY CO., LTD., Shaanxi (CN)

(72) Inventor: Chen Xu, Shaanxi (CN)

(73) Assignee: LONGI GREEN ENERGY TECHNOLOGY CO., LTD., Shaanxi (CN)

( * ) Notice: Subject to any disclaimer, the term of this patent is extended or adjusted under 35 U.S.C. 154(b) by 0 days.

(21) Appl. No.: 18/016,578

(22) PCT Filed: Aug. 19, 2021

(86) PCT No.: PCT/CN2021/113582
§ 371 (c)(1),
(2) Date: Jan. 17, 2023

(87) PCT Pub. No.: WO2022/037653
PCT Pub. Date: Feb. 24, 2022

(65) Prior Publication Data
US 2023/0200096 A1 Jun. 22, 2023

(30) Foreign Application Priority Data
Aug. 20, 2020 (CN) .......................... 202010855550.7

(51) Int. Cl.
*H10K 30/57* (2023.01)
*H10K 30/10* (2023.01)
(Continued)

(52) U.S. Cl.
CPC ............. *H10K 30/57* (2023.02); *H10K 30/10* (2023.02); *H10K 30/86* (2023.02); *H10K 71/12* (2023.02);
(Continued)

(58) Field of Classification Search
CPC ........ H10K 30/57; H10K 30/10; H10K 30/86; H10K 71/12; H10K 71/40; H10K 85/50; H10K 2102/351
See application file for complete search history.

(56) References Cited

U.S. PATENT DOCUMENTS

| | | | |
|---|---|---|---|
| 2016/0190377 A1* | 6/2016 | Green .................... | H10K 30/10 438/74 |
| 2017/0330693 A1* | 11/2017 | Lunt, III ................ | H10K 30/30 |
| 2019/0229285 A1* | 7/2019 | Kuang ................... | H10K 30/40 |

FOREIGN PATENT DOCUMENTS

| | | |
|---|---|---|
| CN | 104465992 | 3/2015 |
| CN | 104465992 A | 3/2015 |

(Continued)

OTHER PUBLICATIONS

Morita, "Architecture of the Interface between the Perovskite and Hole-Transport Layers in Perovskite Solar Cells", ChemSusChem 2016, 9, 2634-2639 (Year: 2016).*
(Continued)

*Primary Examiner* — Devina Pillay
(74) *Attorney, Agent, or Firm* — NIXON PEABODY LLP; Jeffrey L. Costellia (57) ABSTRACT

A tandem cell is provided in the present disclosure, which relates to the technical field of photovoltaics, so as to form a functional layer with high film ordering on a bottom cell, thereby improving photoelectric conversion efficiency of the tandem cell. The tandem cell includes: a bottom cell with a textured surface; a hole transport layer formed on the textured surface of the bottom cell; a second ordered induction layer and a perovskite absorption layer formed on the hole transport layer, the second ordered induction layer being located between the hole transport layer and the perovskite absorption layer; and a transparent conductive layer formed on the perovskite absorption layer. An inducing
(Continued)

material contained in the second ordered induction layer is organic ammonium salt or inorganic lead compound. The tandem cell according to the present disclosure is a tandem cell with a perovskite solar cell as a top cell.

18 Claims, 6 Drawing Sheets

(51) Int. Cl.
  *H10K 30/86* (2023.01)
  *H10K 71/12* (2023.01)
  *H10K 71/40* (2023.01)
  *H10K 85/50* (2023.01)
  *H10K 102/00* (2023.01)

(52) U.S. Cl.
  CPC ............ *H10K 71/40* (2023.02); *H10K 85/50* (2023.02); *H10K 2102/351* (2023.02)

(56) References Cited

FOREIGN PATENT DOCUMENTS

| CN | 104795499 | | 7/2015 |
|---|---|---|---|
| CN | 104795499 | A | 7/2015 |
| CN | 106410039 | | 2/2017 |
| CN | 107104189 | A | 8/2017 |
| CN | 107611281 | | 1/2018 |
| CN | 107634119 | | 1/2018 |
| CN | 108155181 | | 6/2018 |
| CN | 108565342 | | 9/2018 |
| CN | 108807682 | | 11/2018 |
| CN | 109103331 | | 12/2018 |
| CN | 109411607 | | 3/2019 |
| CN | 109411607 | A | 3/2019 |
| CN | 110970562 | A | 4/2020 |
| CN | 111357120 | | 6/2020 |
| CN | 111357120 | A | 6/2020 |
| CN | 112086535 | | 12/2020 |
| JP | 2013-515016 | A | 5/2013 |
| JP | 2017-526176 | A | 9/2017 |
| JP | 2018-093168 | A | 6/2018 |
| KR | 10-2019-0021135 | | 3/2019 |

OTHER PUBLICATIONS

Supplementary Search Report for Application No. 202010855550.7 (1 page).
Chinese Office Action (First) for Application No. 202010855550.7, mailed Apr. 1, 2021 (13 pages).
Chinese Office Action (Second) for Application No. 202010855550.7, mailed Apr. 3, 2021 (16 pages).
International Search Report for Application No. PCT/CN2021/113582, mailed Nov. 17, 2021, (4 pages).
Japanese Office Action for App. No. 2023-512693, mailed Mar. 5, 2024 (11 pages) [Machine Translated].
Chen et al., "Blade-coated perovskites on textured silicon for 26%-efficient monolithic perovskite/silicon tandem solar cells." Joule, vol. 4, No. 4: 850-864 (2020).
Extended European Search Report for App. No. 21857744.3, dated Jan. 18, 2024 (12 pages).
Liang et al. "Efficient perovskite solar cells by reducing interface-mediated recombination: a bulky amine approach." Advanced Energy Materials vol. 10, No. 14: 2000197 (2020).
Schulze et al., "25.1% High-efficiency monolithic Perovskite silicon tandem solar cell with a high bandgap Perovskite absorber." Solar RRL, vol. 4, No. 7: 2000152 (2020).
Tripathi et al., "Novel surface passivation technique for low-temperature solution-processed perovskite PV cells." ACS applied materials & interfaces vol. 8, No. 7: 4644-4650 (2016).
Xu et al., "Triple-halide wide-band gap perovskites with suppressed phase segregation for efficient tandems." Science, vol. 367, No. 6482: 1097-1104 (2020).

\* cited by examiner

TANDEM CELL

CROSS-REFERENCES TO RELATED APPLICATIONS

This application is a national phase of PCT application No. PCT/CN2021/113582, filed on Aug. 19, 2021, which claims the priority of the Chinese patent application filed on Aug. 20, 2020 before the China National Intellectual Property Administration CNIPA with the application number of 202010855550.7 and the title of "LAMINATED BATTERY", which is incorporated herein in its entirety by reference.

TECHNICAL FIELD

The disclosure relates to the technical field of photovoltaics and, more particularly, to a tandem cell.

BACKGROUND

Single-junction solar cells may only absorb sunlight with a fixed wavelength. In order to improve utilization of the sunlight, multiple solar cells with different band gaps may be connected in series through a recombination layer to absorb sunlight with different wavelengths. A perovskite cell has a wide band gap, and a band of absorption spectrum of the perovskite cell may be regulated by adjusting a component ratio. It may be seen that the perovskite cell is an ideal top cell of the tandem cell.

When the perovskite cell and a bottom cell with a textured structure are laminated together, it becomes a difficult point for improvement of photoelectric conversion efficiency of the tandem cell to form a functional layer with high film ordering on the bottom cell.

SUMMARY

An object of the present disclosure is to provide a tandem cell to form a functional layer with high film ordering on a bottom cell, thereby improving photoelectric conversion efficiency of the tandem cell.

In order to achieve the above object, a tandem cell is provided in the present disclosure. The tandem cell includes: a bottom cell with a textured surface; a hole transport layer formed on the textured surface of the bottom cell; a second ordered induction layer and a perovskite absorption layer formed on the hole transport layer, the second ordered induction layer being located between the hole transport layer and the perovskite absorption layer; and a transparent conductive layer formed on the perovskite absorption layer. An inducing material contained in the second ordered induction layer is organic ammonium salt or inorganic lead compound.

When the above technical solution is adopted, the perovskite absorption layer is grown on the second ordered induction layer, and with buffering effect of the second ordered induction layer, the perovskite absorption layer may avoid an adverse effect on the molecular disorder on the surface of the hole transport layer. Meanwhile, with induction of the second ordered induction layer, the perovskite absorption layer may be grown in order, with high crystallinity and a large grain size. At this time, the perovskite absorption layer has fewer defects and higher photoelectric conversion efficiency. In addition, the second ordered induction layer, as an intermediate layer between the hole transport layer and the perovskite absorption layer, may reduce energy-level gap between films, form energy-level matching beneficial to hole transport, and improve hole transport performance of the tandem cell.

When the inducing material of the second ordered induction layer is the organic ammonium salt or the inorganic lead compound. The organic ammonium salt or the inorganic lead compound present high crystal structure matching degree and similar properties to perovskite material of the perovskite absorption layer, which is prone to inducing growth of a highly ordered perovskite absorption layer.

In some possible implementations, the inorganic lead compound is one or more of lead oxide, lead bromide, lead iodide, lead chloride, lead acetate, lead thiocyanate and lead sulfide. These inorganic lead compounds are metal oxides, which have good compatibility with a hole transport layer of metal oxides, so that good interface contact may be formed between the second ordered induction layer and the hole transport layer. Meanwhile, the inorganic lead compound and a perovskite material of the perovskite absorption layer are both lead compounds, and they have good compatibility, which makes it easier for the second ordered induction layer to induce growth of the perovskite absorption layer.

In some possible implementations, a thickness of the second ordered induction layer is 1 nm to 20 nm.

In some possible implementations, the tandem cell further includes a first ordered induction layer. The first ordered induction layer is located between the bottom cell and the hole transport layer.

Similar to the mechanism of the second ordered induction layer, with interface buffering and induction of the first ordered induction layer, the hole transport layer may be grown orderly, with higher crystallinity and a large grain size, thus reducing defects of the hole transport layer and improving hole transport performance of the hole transport layer. In addition, the first ordered induction layer, as an intermediate layer between the hole transport layer and the bottom cell, may reduce energy-level gap between films, and form energy-level matching between the hole transport layer and the bottom cell which is beneficial to hole transport, thus improving the hole transport performance of the tandem cell.

When an inducing material of the first ordered induction layer is a rod-shaped molecular material, the rod-shaped molecular material easily stands upright on a lower film through close packing, forming a highly ordered geometric channel. The highly ordered geometric channel may induce an upper organic film to grow along an orientation of the geometric channel through strong interaction. At this time, the first ordered induction layer containing the rod-shaped molecular material has a good ordered-growth-inducing effect on its upper film. Moreover, the rod-shaped molecular material has properties similar to liquid crystal in a thin film with a thinner thickness, which is with a low liquid-crystal phase temperature, and is easy to form a large-area and highly ordered first ordered induction layer through fluidity of liquid crystal at a low temperature.

In some possible implementations, the inducing material contained in the first ordered induction layer is metal oxide, and the hole transport layer is made of an inorganic hole-transport material.

When the above technical solution is adopted, the metal oxide is an inorganic material, which has similar material properties to those of the inorganic hole transport layer made of inorganic materials, so that good interface contact may be formed between the first ordered induction layer and the hole transport layer, with better compatibility and being is prone to inducing ordered growth of the hole transport layer.

In some possible implementations, a thickness of the first ordered induction layer is 1 nm to 20 nm. The rod-shaped molecular material or the like in the first ordered induction layer with this thickness is prone to having properties similar to liquid crystal, so that a large-area ordered film may be easily formed.

In some possible implementations, the rod-shaped molecular material is BPTT and the metal oxide is zinc oxide.

In some possible implementations, the hole transport layer may be made of one or more of PTAA, Cz2T, Spiro-OMeTAD, Spiro-TTB, copper phthalocyanine and nickel oxide.

In some possible implementations, a thickness of the hole transport layer is 5 nm to 100 nm.

In some possible implementations, processes for forming the first ordered induction layer, the second ordered induced layer and the hole transport layer may be a magnetron sputtering process, a laser pulse deposition process, a thermal evaporation coating process, a chemical vapor deposition process, a solution coating process, a gel-sol process or a nanoparticle hydrothermal synthesis process.

In some possible implementations, a method of forming the perovskite absorption layer includes:
forming lead iodide and cesium bromide on the second ordered induction layer by co-evaporation,
coating a mixed solution of formamidine hydroiodide and formamidine hydrobromide on lead iodide and cesium bromide to form a perovskite material film; and
annealing the perovskite thin film to form the perovskite absorption layer.

The above description is only a summary of technical solutions of the present disclosure, which may be implemented according to contents of the specification in order to better understand technical means of the present disclosure; and in order to make above and other objects, features and advantages of the present disclosure more obvious and understandable, detailed description of the present disclosure is particularly provided in the following.

BRIEF DESCRIPTION OF THE DRAWINGS

The drawings illustrated here are intended to provide further understanding of the present disclosure and form a part of it. Illustrative embodiments of the present disclosure and their descriptions are used to explain the present disclosure, but do not constitute undue restrictions on the present disclosure. In the drawings.

DETAILED DESCRIPTION OF THE EMBODIMENTS

In order to make technical problems to be solved by the disclosure, technical solutions and beneficial effects more clear, the disclosure will be further described in detail with reference to the drawings and embodiments. It should be understood that specific embodiments described herein are only used to explain the present disclosure, and are not intended to limit the present disclosure.

It should be noted that when an element is said to be "fixed" or "provided" on another element, it may be directly or indirectly on the another element. When an element is said to be "connected" to another element, it may be directly or indirectly connected to the another element.

In addition, terms "first" and "second" are only used for descriptive purposes, and cannot be understood as indicating or implying relative importance. Therefore, features defined with "first" or "second" may include one or more of these features explicitly or implicitly. In the description of this disclosure, "multiple" means two or more, unless otherwise specifically defined. Meaning of "several" is one or more than one, unless otherwise specifically defined.

In the description of the present disclosure, it should be understood that an orientation or positional relationship indicated by terms "upper", "lower", "front", "rear", "left", "right" is based on an orientation or positional relationship shown in the drawings, and is merely for convenience of describing the present disclosure and simplifying the description, rather than indicates or implies that the device or element referred to must have a specific orientation, be configured and operated in a specific orientation, and thus cannot be understood as limitation on the present disclosure.

In the description of this disclosure, it should also be noted that unless otherwise specified and defined, the terms "installing", "connecting" and "coupling" should be understood in a broad sense, for example, it may be "fixedly connecting", or "detachably connecting" or "integrally connecting", or it may be "mechanically connecting" or "electrically connecting", or it may be "directly connecting" or "indirectly connecting through an intermediate medium", or it may be "communicating within two elements" or "interaction between two elements". For ordinary skilled in the art, specific meanings of the above terms in the present disclosure may be understood according to specific situations.

At present, a crystalline silicon cell, as a mainstream product in the photovoltaic field, is a high-efficiency crystalline silicon photovoltaic cell technology, with cell efficiency (26.7%) being close to its theoretical limit efficiency (29.4%). With continuous development of the photovoltaic technology, tandem cell technology has been proved to be an effective way to break through efficiency of traditional crystalline silicon photovoltaic cells.

Organic-inorganic hybrid perovskite solar cells, as a new type of high-efficiency and low-cost solar cells, have attracted an extensive worldwide attention. In just a few years, photoelectric conversion efficiency of a perovskite solar cell has rapidly climbed from 3.8% in 2009 to over 25%, which is close to efficiency of commercial silicon-based solar cells. An absorption band gap of the perovskite cell may be adjusted in a range of 1.5 eV-1.8 eV for the perovskite cell by adjusting a component formula, which may make the perovskite cell to be an ideal tandem top cell. A crystalline silicon-perovskite tandem cell made by combining the perovskite cell and a crystalline silicon cell is expected to achieve photoelectric conversion efficiency of more than 30%. At present, it has been proved that the conversion efficiency of the crystalline silicon-perovskite tandem cell may reach more than 25%.

In the crystalline silicon-perovskite tandem cell, the crystalline silicon cell is used as a bottom cell to absorb energy of sunlight with a wavelength of 800 nm to 1200 nm, and the perovskite cell is used as a top cell to absorb energy of sunlight with a wavelength of 300 nm to 800 nm. The bottom cell and the top cell are connected by a recombination layer to form a series-connected cell. An overall open-circuit voltage of the tandem cell is superposition of open-circuit voltages of the top cell and the bottom cell, while a current of the tandem cell is minimum of currents of the top cell and the bottom cell. At this time, good current matching between the top cell and the bottom cell is required.

In the related art, for the perovskite cell, various functional layers in a device may be prepared by solution spin-coating. A double pyramid textured and light-trapping structure is generally adopted in a high-efficiency crystalline silicon bottom cell to improve absorption and utilization of sunlight, thus improving conversion efficiency of the cell. When a perovskite top cell is fabricated on the crystalline silicon bottom cell with a textured structure, the micron-sized pyramid textured and light-trapping structure in the crystalline silicon bottom cell is a great challenge for preparation of the perovskite top cell by a solution method. Difficulty lies in that thickness of respective functional layers of the perovskite cell is generally several hundred nanometers, and materials of the respective functional layers in a solution state are easy to accumulate at a bottom of the pyramid textured structure, so it is difficult for the respective functional layers to be uniformly deposited on a micron-sized pyramid textured surface by solution spin-coating. At present, the solution is to polish the crystalline silicon bottom cell and reduce roughness of the textured surface in contact with the perovskite top cell, so as to make it possible to prepare the perovskite top cell by solution. Although the perovskite top cell may be fabricated on the crystalline silicon bottom cell by solution spin-coating in this method, it loses cell efficiency gain caused by the textured structure and light-trapping effect thereof. Meanwhile, a polishing process greatly increases manufacturing cost of a whole cell.

The key to prepare the perovskite top cell on the textured surface of the crystalline silicon bottom cell lies in how to uniformly deposit respective functional layers of the perovskite top cell (a hole transport layer, a perovskite absorption layer, an electron transport layer, a hole blocking layer, an electrode buffer layer, an electrode, etc.) on the textured surface. Compared with the solution processing method, various functional materials that may be evaporated may be uniformly deposited on various substrates using a vacuum deposition process. Therefore, the vacuum deposition process is a better choice for preparing the perovskite top cell on the textured surface of the crystalline silicon bottom cell.

In an existing preparation process of the crystalline silicon-perovskite tandem cell, the hole transport layer is grown directly on a tunneling recombination layer. The tunneling recombination layer is usually made of inorganic materials such as heavily doped microcrystalline silicon. There are two kinds of materials for the hole transport layer, one is an organic semiconductor, such as 2,2',7,7'-tetra(bis-p-tolylamino)spiro-9,9'-difluorene (spiro-TTB); and the other is inorganic semiconductor, such as nickel oxide. When different types of hole transport materials are directly grown on an inorganic tunneling recombination layer, there are many nucleation sites for material molecules of the hole transport layer on a surface of the tunneling recombination layer due to high disorder of molecules on the surface of the tunneling recombination layer made of inorganic materials and difference in material properties of organic materials; and it is easy to form small-sized island-like growth structures. At this time, there are some problems in the prepared hole transport layer, such as low lattice matching, many grain boundary defects, poor interface contact performance and poor film ordering, which lead to poor hole transport performance. Main reasons for these problems are poor compatibility between the hole transport layer and the tunneling recombination layer and uncontrolled film growth caused by the high disorder of the tunneling recombination layer. Similarly, the perovskite absorption layer is often deposited directly on the hole transport layer. When the hole transport layer is made of an inorganic semiconductor material, a perovskite material of perovskite absorption layer, as an organic-inorganic hybrid material, has a problem of compatibility with nickel oxide. If the perovskite material is directly deposited on an inorganic material, disorder of the inorganic material causes increase of crystallization nucleation sites for the perovskite material and growth of small-sized grains, thus with poor controllability of film growth. It may be seen that both the hole transport layer and the perovskite absorption layer are faced with problems of poor interface compatibility, small grain size and low film ordering. These defects often affect performance of the respective functional layers and reduce the photoelectric conversion efficiency of the tandem cell.

It may be seen from the above that it is a key for improvement of the photoelectric conversion efficiency of the tandem cell to form the respective functional layers with high film ordering on the bottom cell.

To solve above problems, a tandem cell is provided in an embodiment of the present disclosure. The tandem cell may be a tandem cell with the perovskite cell as a top cell and any one of a crystalline silicon cell, a polycrystalline silicon cell, an ingot monocrystalline silicon cell, a copper indium gallium selenide cell, a perovskite cell, a gallium arsenide cell and an organic photovoltaic cell as a bottom cell, which is not limited thereto.

Figure 1:
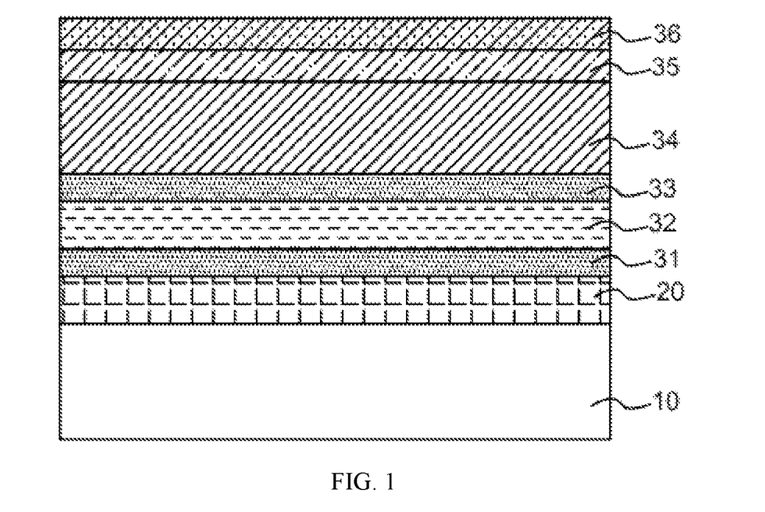
FIG. 1 is a schematic structural diagram of a tandem cell according to an embodiment of the present disclosure.

As shown in FIG. 1, the tandem cell according to an embodiment of the present disclosure includes a sequentially laminated bottom cell 10, a first ordered induction layer 31, a hole transport layer 32, a second ordered induction layer 33, a perovskite absorption layer 34, and a transparent conductive layer 36.

As shown in FIG. 1, the bottom cell 10 may be any of the above-mentioned bottom cells that may be applied to the tandem cell. The bottom cell 10 may be an n-type solar cell or a p-type solar cell. Regardless of its structure, any type of bottom cell 10 may have a textured surface. The textured surface may be formed on the front and back of the bottom cell 10 by a texturing process. Specifically, the textured structure may be a textured surface with a pyramid shape or a textured surface with an inverted pyramid shape.

Taking the crystalline silicon cell as an example, a structure of the bottom cell may include a p-type crystalline silicon wafer or an n-type crystalline silicon wafer formed with a p-n junction. The p-type crystalline silicon wafer or n-type crystalline silicon wafer with the p-n junction serves as a light absorption layer of the bottom cell for absorbing sunlight and convert photons into photo-generated carriers. The front and back of the p-type crystalline silicon wafer or n-type crystalline silicon wafer with the p-n junction may be textured by a texturing process.

As shown in FIG. 1, the tandem cell may further include a tunneling recombination layer 20 on the bottom cell 10 to realize tunneling recombination and collection of photo-generated carriers in the bottom cell 10 and the perovskite top cell. The tunneling recombination layer 20 may be a tunneling recombination layer 20 made of transparent metal oxide such as tin-doped indium oxide (ITO), zinc-doped indium oxide (IZO), tungsten-doped indium oxide (IWO), titanium-doped indium oxide (ITIO), fluorine-doped tin oxide (FTO), aluminum-doped zinc oxide (AZO) and the like.

The tunneling recombination layer 20 may also be a tunneling recombination layer 20 made of heavily doped microcrystalline silicon reverse to the p-n junction of the bottom cell 10. For example, the tunneling recombination layer 20 is composed of an n-type doped microcrystalline silicon layer and a p-type doped microcrystalline silicon layer. The p-type doped microcrystalline silicon layer is in direct contact with the hole transport layer 32, and the n-type doped microcrystalline silicon layer is in direct contact with the bottom cell 10. Specifically, the n-type doped microcrystalline silicon layer may be a phosphorus-doped microcrystalline silicon layer, and the p-type doped microcrystalline silicon layer may be a boron-doped microcrystalline silicon layer.

As shown in FIG. 1, in practical applications, the tunneling recombination layer 20 may be fabricated by one of a plasma chemical vapor deposition (PECVD) process, a magnetron sputtering process, a hot-filament chemical vapor deposition process and a catalytic chemical vapor deposition process. Since the bottom cell 10 has a textured surface, the tunneling recombination layer 20 conformally grown on the bottom cell 10 also has a textured structure.

As shown in FIG. 1, the first ordered induction layer 31 is formed on the tunneling recombination layer 20. It should be noted that in the practical applications, the first ordered induction layer 31 may also be omitted. A process of forming the first ordered induction layer 31 may be a magnetron sputtering process, a laser pulse deposition process, a thermal evaporation coating process, a chemical vapor deposition process, a solution coating process, a gel-sol process or a nanoparticle hydrothermal synthesis process.

As shown in FIG. 1, in order to improve ordering of the first ordered induction layer 31, parameters such as a thickness of the first ordered induction layer 31 may be adjusted, so that an inducing material used to make the first ordered induction layer 31 has properties similar to liquid crystal, thereby forming a large-area ordered film, which is beneficial to improving ordering of the first ordered induction layer 31. When the first ordered induction layer 31 has high ordering, it is beneficial to ordered growth of the hole transport layer 32 on its upper layer, thus reducing defects of the hole transport layer 32 and improving hole transport performance.

For example, when the thickness of the first ordered induction layer 31 is 1 nm to 20 nm, the first ordered induction layer 31 is an ultra-thin film, and the inducing material of the first ordered induction layer 31 is prone to having properties similar to liquid crystal in the ultra-thin film, so that it is easy to form a large-area ordered film through fluidity of the liquid crystal, which is beneficial to improving the ordering of the first ordered induction layer 31. The thickness of the first ordered induction layer 31 may be 1 nm, 5 nm, 8 nm, 10 nm, 12 nm, 18 nm, 20 nm, or the like.

As shown in FIG. 1, the hole transport layer 32 is formed on the first ordered induction layer 31. A process of forming the hole transport layer 32 may be a magnetron sputtering process, a laser pulse deposition process, a thermal evaporation coating process, a chemical vapor deposition process, a solution coating process, a gel-sol process or a nanoparticle hydrothermal synthesis process. It should be understood that a thickness of the hole transport layer 32 may be 5 nm to 100 nm. For example, the thickness of the hole transport layer 32 is 5 nm, 10 nm, 30 nm, 50 nm, 60 nm, 70 nm, 80 nm, 90 nm, 100 nm, or the like.

As shown in FIG. 1, the hole transport layer 32 is induced by Van der Waals effect of the first ordered induction layer 31, and is formed on the first ordered induction layer 31, and has a specific orientation, phase state and an ordered condensed state structure.

As shown in FIG. 1, the above-mentioned first ordered induction layer 31 has weak epitaxial ability, and a lattice matching relationship between the first ordered induction layer 31 and the hole transport layer 32 may be formed with weak epitaxial interaction (Van der Waals effect), so as to induce the ordered growth of the hole transport layer 32, thereby realizing control of a microstructure of the hole transport layer 32.

As shown in FIG. 1, in the practical applications, in order to form a highly ordered first ordered induction layer 31 so that the first ordered induction layer 31 has a good ordering inducing effect, a rod-shaped molecular material may be selected as the inducing material of the first ordered induction layer 31 to induce the hole transport layer 32 made of an organic hole transporting material. The rod-shaped molecular material easily stands upright on a lower film (the tunneling recombination layer 20) through close packing, forming a highly ordered geometric channel. Moreover, the rod-shaped molecular material has properties similar to liquid crystal in a thin film with a thinner thickness, which is with a low liquid-crystal phase temperature, and is easy to form a large-area and highly ordered film through fluidity of liquid crystal at a low temperature. It may be seen that due to molecular characteristics and liquid crystal characteristics of the rod-shaped molecular material, the rod-shaped molecular material is easy to form the highly ordered first ordered induction layer 31, and thus have a better ordered growth inducing effect. Specifically, dibenzothiophene (BPTT) may be selected as the rod-shaped molecular material. BPTT may form a geometric channel with a stable structure, which may induce a film with highly ordered growth and good stability.

In the practical applications, metal oxide may also be selected as the inducing material of the first ordered induction layer 31 to induce the hole transport layer 32 made of an inorganic hole transporting material. At this time, the metal oxide is an inorganic material, which has similar material properties to those of the inorganic hole transport layer 32 made of inorganic materials, so that good interface contact may be formed between the first ordered induction layer 31 and the hole transport layer 32, with better compatibility and being prone to inducing ordered growth of the hole transport layer 32. Specifically, the metal oxide may be zinc oxide.

The hole transport layer 32 may be made of one or more of PTAA, Cz2T, Spiro-OMeTAD, Spiro-TTB, copper phthalocyanine and nickel oxide, and be not limited to this.

For example, when the inducing material of the first ordered induction layer 31 is BPTT, the ordered growth of a copper phthalocyanine material may be induced by Van der Waals effect (weak interaction) of the geometric channel on a surface of a BPTT film. In addition, due to weak interaction between BPTT film and the copper phthalocyanine film, there is only an orientation relationship between them, but no strict lattice matching relationship between them. Therefore, a copper phthalocyanine hole transport layer with no commensurability relationship with the first ordered induction layer 31 may be fabricated.

As shown in FIG. 1, in the practical applications, a material with strong compatibility and interaction with the hole transport layer 32 may be further selected to manufacture the first ordered induction layer 31 according to material properties of the hole transport layer 32 that needs to be induced to grow. For example, when the hole transport layer 32 is made of nickel oxide, the inducing material contained in the first ordered induction layer 31 may be zinc oxide. When the hole transport layer 32 is made of Cz2T, the inducing material contained in the first ordered induction layer 31 may be BPTT.

Figure 2:
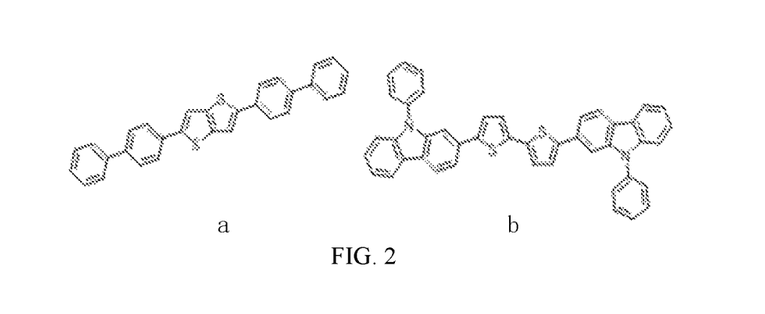
FIG. 2 is a schematic diagram of molecular structures of BPTT and Cz2T according to the embodiment of the present disclosure, wherein pattern a is a schematic structural diagram of BPTT and pattern b is a schematic structural diagram of Cz2T.

For ease of understanding, the BPTT is used as an example to illustrate the process by which the first ordered induced layer 31 induces the ordered growth of the cavity transport layer 32. FIG. 2 shows molecular structures of BPTT and Cz2T. As shown in FIG. 2, BPTT is a rigid rod-shaped molecule, which is easy to form a highly ordered film on a surface of the tunneling recombination layer 20, with its terminal benzene ring forming a geometric channel with a specific orientation on a surface of a crystal array. When the hole transport layer 32 made of Cz2T is grown on the surface of the first ordered induction layer 31 made of BPTT, there is van der Waals interaction between hydrogen atoms on a peripheral benzene ring of a Cz2T molecule and a benzene ring in the geometric channel formed by the BPTT material, thus inducing the Cz2T molecule to grow along the geometric channel of BPTT. During growth of the Cz2T molecule along the geometric channel of BPTT, Van der Waals interaction between the Cz2T molecule and a BPTT molecule is weak, and there is an orientation relationship between the growth of the Cz2T molecule and the first ordered induction layer 31 of BPTT, which makes the Cz2T molecule stack neatly along the geometric channel formed by the BPTT molecule, thus forming a highly ordered hole transport layer 32. Meanwhile, there is no strict lattice matching relationship between the Cz2T molecules and the BPTT molecules, so the thickness of the hole transport layer 32 may be prevented from being affected by the first ordered induction layer 31.

It may be seen from the above that with buffering and inducing effect of the first ordered induction layer 31, the hole transport layer 32 may grow orderly, with high crystallinity and a large grain size. At this time, the hole transport layer 32 has fewer defects and better hole transport performance. In addition, the first ordered induction layer 31, as an intermediate layer between the hole transport layer 32 and the tunneling recombination layer 20, may reduce energy-level gap between films, and form energy-level matching between the hole transport layer 32 and the tunneling recombination layer 20, thus improving the hole transport performance of the tandem cell.

On this basis, as shown in FIG. 1, a second ordered induction layer 33 is formed on the hole transport layer 32. A process of forming the second ordered induction layer 33 may be a magnetron sputtering process, a laser pulse deposition process, a thermal evaporation coating process, a chemical vapor deposition process, a solution coating process, a gel-sol process or a nanoparticle hydrothermal synthesis process.

A thickness of the second ordered induction layer 33 manufactured by the above method may be 1 nm to 20 nm. For example, the thickness of the second ordered induction layer 33 is 1 nm, 5 nm, 8 nm, 10 nm, 12 nm, 18 nm, 20 nm, or the like.

As shown in FIG. 1, the perovskite absorption layer 34 is formed on the second ordered induction layer 33. A method of forming the perovskite absorption layer 34 may include forming lead iodide and cesium bromide on the hole transport layer 32 by co-evaporation. A mixed solution of formamidine hydroiodide and formamidine hydrobromide is coated on lead iodide and cesium bromide to form a perovskite material film. The perovskite thin film is annealed to form the perovskite absorption layer 34.

A thickness of the perovskite absorption layer 34 may be 250 nm to 1000 nm, which may also be set according to actual situations. The thickness of the perovskite absorption layer 34 may be 250 nm, 350 nm, 500 nm, 700 nm, 800 nm, 900 nm, 1000 nm, or the like.

The perovskite absorption layer 34 may be made of one or more perovskite materials. A general chemical formula of a perovskite material is $ABX_3$, where A is one or more of $CH_3NH_3$ cation, $C_4H_9NH_3$ cation, $NH_2=CHNH_2$ cation and Cs cation; and B is one or two of $Pb^{2+}$ and $Sn^{2+}$; and X is one or more of $Cl^-$, $Br^-$ and $I^-$.

As shown in FIG. 1, the perovskite absorption layer 34 is formed on the second ordered induction layer 33, and has a specific orientation, phase state and ordered condensed state structure. The second ordered induction layer 33 is configured to provide interface buffering and induce ordered growth of the perovskite absorption layer 34 in its upper layer, so as to prepare the perovskite absorption layer 34 with high ordering, improve energy-level matching between the hole transport layer 32 and the perovskite absorption layer 34, and improve the hole transport performance.

In order to form the second ordered induction layer 33 with high ordering and make the second ordered induction layer 33 have a good order inducing effect, organic ammonium salt may be selected as the inducing material or inorganic lead compound with similar properties to the perovskite material may be selected as the inducing material.

When the inducing material of the second ordered induction layer is the organic ammonium salt or the inorganic lead compound. The organic ammonium salt or the inorganic lead compound present high crystal structure matching degree and similar properties to the perovskite material of the perovskite absorption layer 34, which is prone to inducing growth of a highly ordered perovskite absorption layer 34.

As shown in FIG. 1, in the practical applications, the organic ammonium salt may be ammonium acetate, etc. The inorganic lead compound may be one or more of lead oxide, lead bromide, lead iodide, lead chloride, lead acetate, lead thiocyanate and lead sulfide. These inorganic lead compounds are metal oxides, which have good compatibility with a hole transport layer 32 of metal oxides, so that good interface contact may be formed between the second ordered induction layer 33 and the hole transport layer 32. Meanwhile, the inorganic lead compound and a perovskite material of the perovskite absorption layer 34 are both lead compounds, and they have good compatibility, which makes it easier for the second ordered induction layer 33 to induce growth of the perovskite absorption layer 34.

It can be seen from the above that the perovskite absorption layer 34 is grown on the second ordered induction layer 33, and with buffering effect of the second ordered induction layer 33, adverse effect of disorder of molecules on the surface of the hole transport layer 32 may be avoided for the perovskite absorption layer 34. Meanwhile, with induction of the second ordered induction layer 33, the perovskite absorption layer 34 may be grown in order, with high crystallinity and a large grain size. At this time, the perovskite absorption layer 34 has fewer defects and higher photoelectric conversion efficiency. In addition, the second ordered induction layer 33, as an intermediate layer between the hole transport layer 32 and the perovskite absorption layer 34, may reduce energy-level gap between films, form energy-level matching beneficial to hole transport, and improve hole transport performance of the tandem cell.

As shown in FIG. 1, an electron transport layer 35 may be disposed between the transparent conductive layer 36 and the perovskite absorption layer 34 to realize transport of photo-generated carriers. The material of electron transport layer 35 may be $SnO_2$ or the like.

As shown in FIG. 1, the transparent conductive layer 36 is formed on the electron transport layer 35 to realize collection of the photo-generated carriers. Of course, if the electron transport layer 35 is omitted, the transparent conductive layer 36 may be directly formed on the perovskite absorption layer 34. The transparent conductive layer 36 may be made of one or more of transparent metal oxide such as tin-doped indium oxide (ITO), zinc-doped indium oxide (IZO), tungsten-doped indium oxide (IWO), titanium-doped indium oxide (ITIO), fluorine-doped tin oxide (FTO), aluminum-doped zinc oxide (AZO) and the like.

The above presents the tandem cell according to the embodiment of the present disclosure, it should be understood that an electrode 37 should be formed on the front and back of the tandem cell, that is, on the transparent conductive layer 36 and a side of the bottom cell 10 away from the perovskite top cell.

Figure 3:
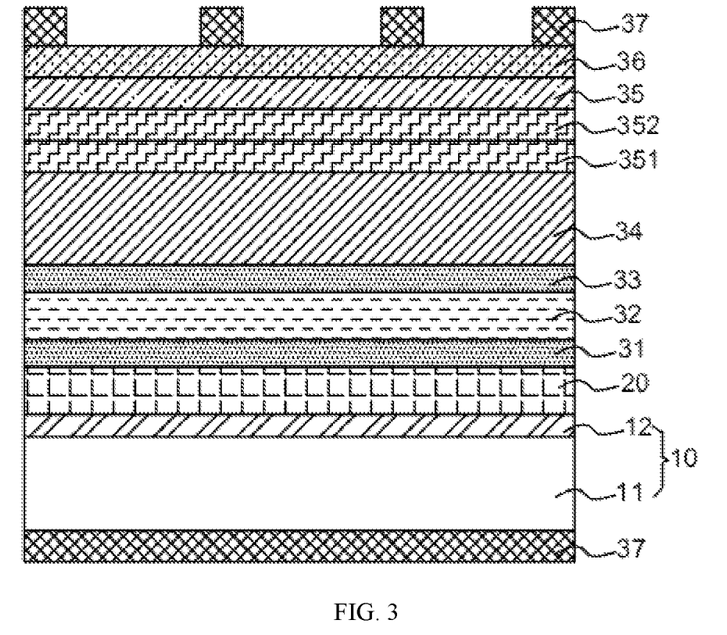
FIG. 3 is a schematic structural diagram of a p-type crystalline silicon-perovskite tandem cell according to an embodiment of the present disclosure.

A manufacturing method of the tandem cell is provided in an embodiment of the present disclosure. Specifically, taking the p-type crystalline silicon-perovskite tandem cell shown in FIG. 3 as an example, the manufacturing method will be described below, of which specific steps are as follows.

Figure 4:
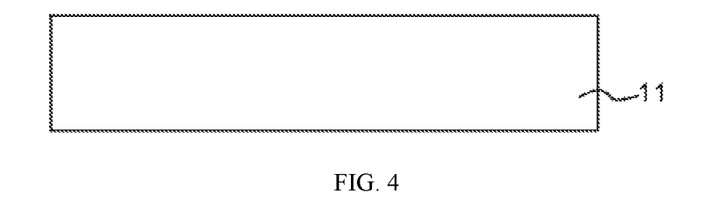
FIGS. 4 to 14 are schematic diagrams of various stages of a manufacturing method of a p-type crystalline silicon-perovskite tandem cell according to embodiments of this disclosure.

As shown in FIG. 4, a p-type crystalline silicon wafer 11 is provided. The p-type crystalline silicon wafer 11 is polished, textured and cleaned in sequence to form the p-type crystalline silicon wafer 11 with a textured surface.

Figure 5:
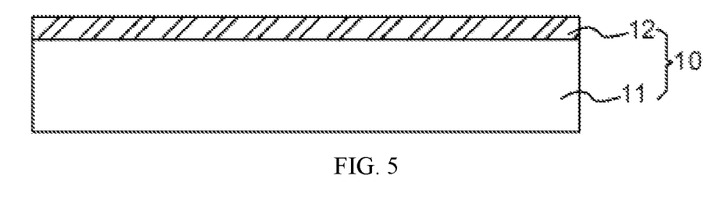

As shown in FIG. 5, an n-type heavily doped layer 12 is formed on a surface of the p-type crystalline silicon wafer 11 with the textured surface by ion implantation and other diffusion processes. At this time, the p-type crystalline silicon wafer 11 has a p-n junction, and a structure obtained in the above steps is defined as the bottom cell 10.

Figure 6:
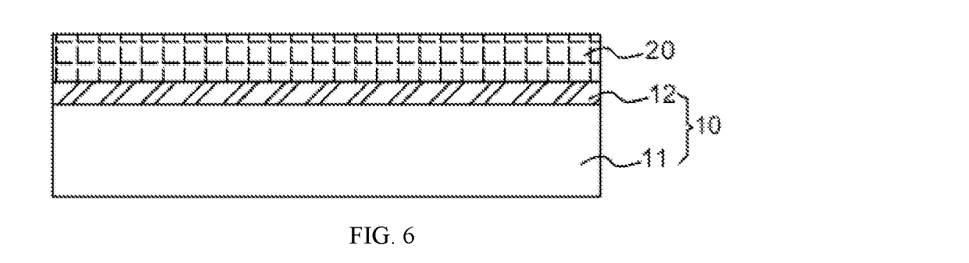

As shown in FIG. 6, a tunneling recombination layer 20 made of a transparent metal oxide material is formed on a side (bottom cell 10) of the p-type crystalline silicon wafer 11 with the p-n junction by a PECVD process, a magnetron sputtering process, a hot filament chemical vapor deposition process or a catalytic chemical vapor deposition process.

Figure 7:
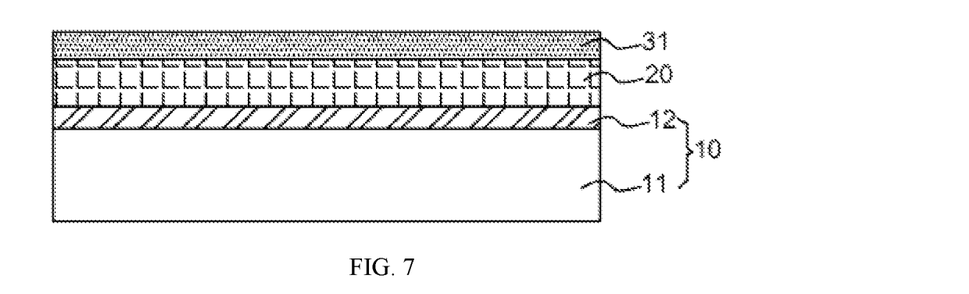

As shown in FIG. 7, a first ordered induction layer 31 with a thickness of 1 nm to 20 nm is formed on the tunneling recombination layer 20 using the magnetron sputtering process, the laser pulse deposition process, the thermal evaporation coating process, the chemical vapor deposition process, the solution coating process, the gel-sol process or the nanoparticle hydrothermal synthesis process.

Figure 8:
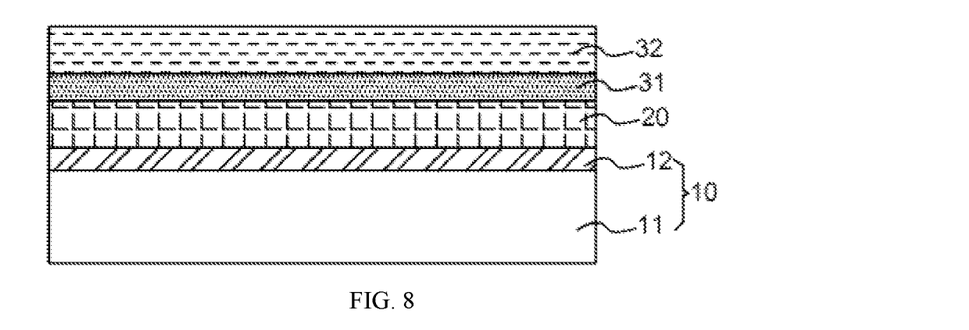

As shown in FIG. 8, a hole transport layer 32 with a thickness of 5 nm to 100 nm is formed on the first ordered induction layer 31 using the magnetron sputtering process, the laser pulse deposition process, the thermal evaporation coating process, the chemical vapor deposition process, the solution coating process, the gel-sol process or the nanoparticle hydrothermal synthesis process.

Figure 9:
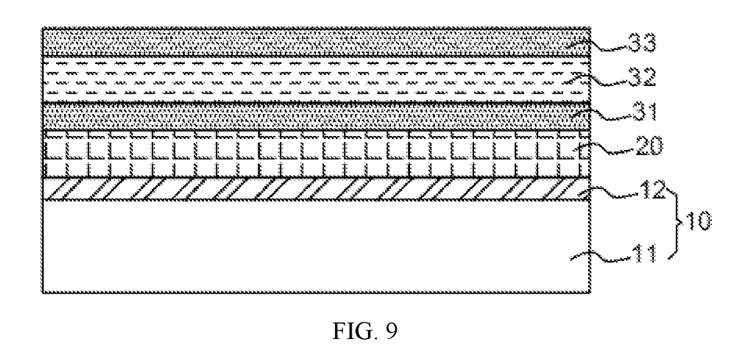

As shown in FIG. 9, a second ordered induction layer 33 with a thickness of 1 nm to 20 nm is formed on the hole transport layer 32 using the magnetron sputtering process, the laser pulse deposition process, the thermal evaporation coating process, the chemical vapor deposition process, the solution coating process, the gel-sol process or the nanoparticle hydrothermal synthesis process.

Figure 10:
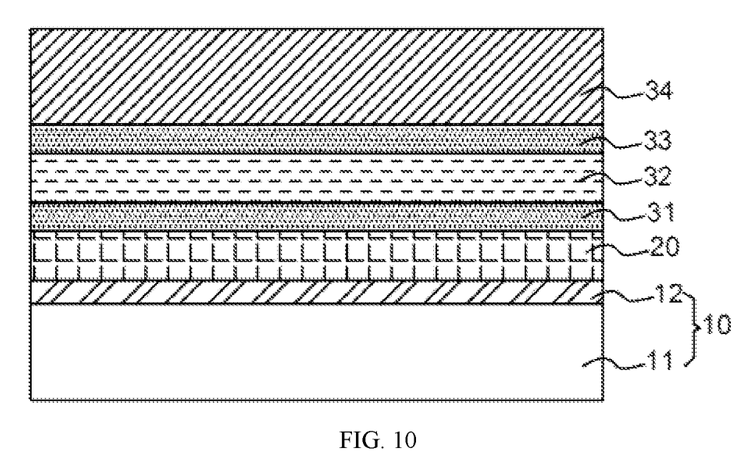

As shown in FIG. 10, a perovskite absorption layer 34 with a thickness of 250 nm to 1000 nm is formed on the second ordered induction layer 33. This specifically includes following content.

Lead iodide and cesium bromide are formed on the second ordered induction layer 33 by co-evaporation, with a rate of cesium bromide (CsBr) being 0.05 Å/s to 0.2 Å/s, a rate of lead iodide ($PbI_2$) being 0.1 Å/s to 10 Å/s, and a total thickness of 250 nm to 1000 nm.

A mixed solution of formamidine hydroiodide (FAI) and formamidine hydrobromide (FABr) was coated on lead iodide and cesium bromide, and the mixed solution of FAI and FABr is reacted with lead iodide and cesium bromide so as to form a film of a perovskite material. A solvent of the mixed solution of FAI and FABr may be ethanol or isopropanol.

The film of the perovskite material is annealed for 5 to 30 minutes at a temperature of 100 to 200° C. to form the perovskite absorption layer 34. A material composition of the perovskite absorption layer 34 is $Cs_xFA_{1-x}Pb(Br_yI_{1-y})_3$, and a thickness of the perovskite absorption layer 34 may be 100 nm to 1000 nm.

Figure 11:
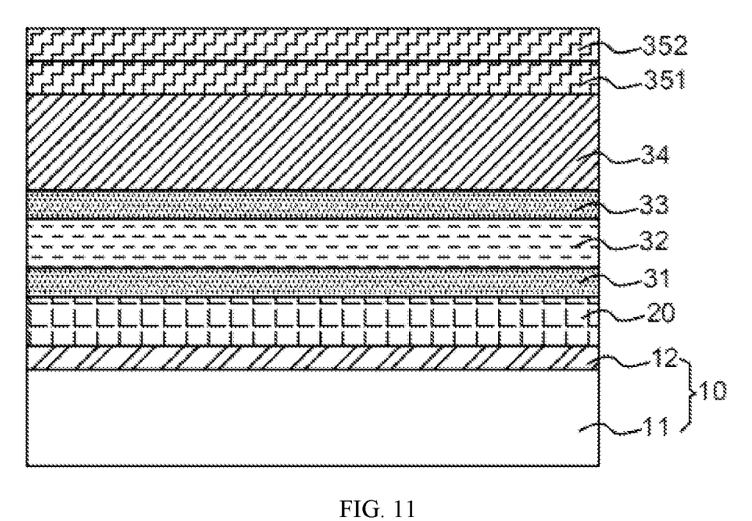

As shown in FIG. 11, an electron transport interface layer 351 with a thickness of 0.1 nm to 10 nm and a current-leakage repair layer 352 with a thickness of 1 nm to 20 nm are formed on the perovskite absorption layer 34 by a thermal evaporation process. The electron transport interface layer 351 may be made of LiF. The current-leakage repair layer 352 may be made of $C_{60}$ or fullerene derivatives (PCBM).

Figure 12:
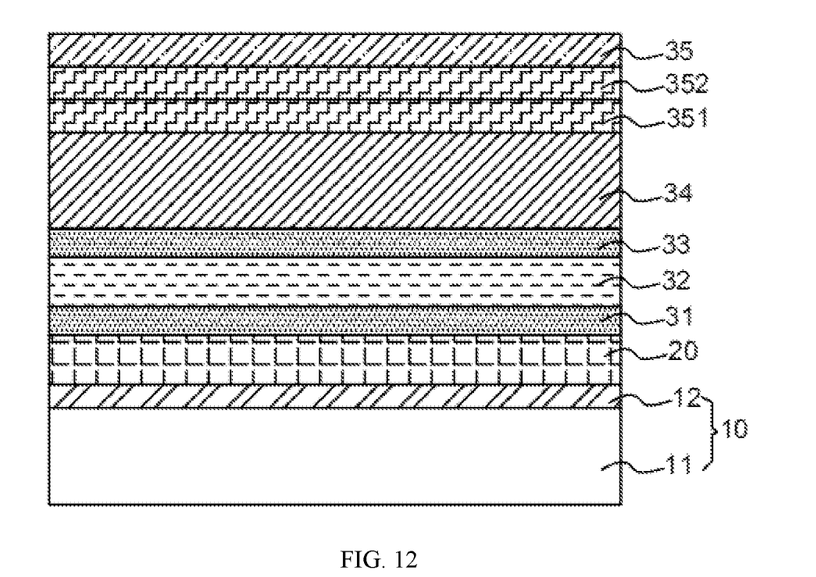

As shown in FIG. 12, an electron transport layer 35 with a thickness of 1 nm-30 nm is formed on the current-leakage repair layer 352 by using any one of a chemical vapor deposition process, a physical vapor deposition process, an atomic layer deposition process and a solution coating process. The electron transport layer 35 may be made of $SnO_2$.

Figure 13:
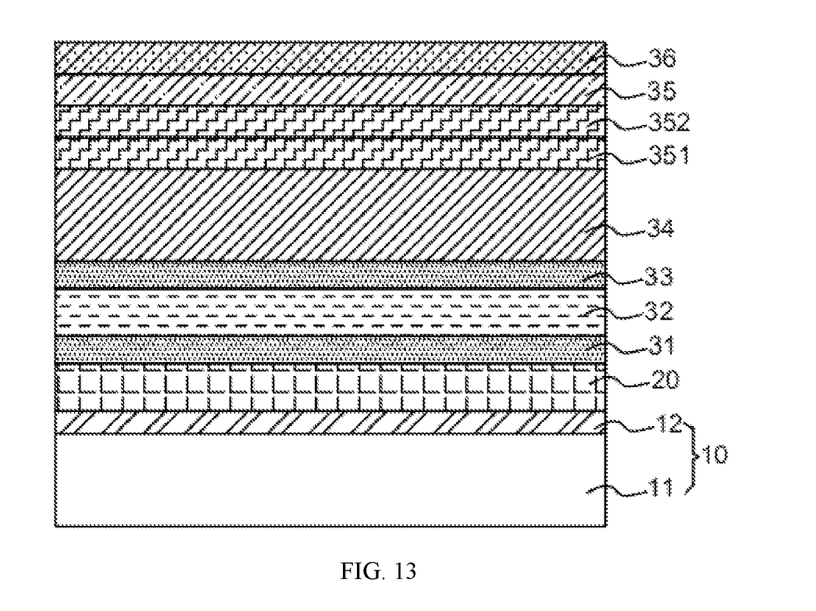

As shown in FIG. 13, a transparent conductive layer 36 made of transparent metal oxide with a thickness of 30 nm to 200 nm is formed on the electron transport layer 35 by the magnetron sputtering process.

Figure 14:
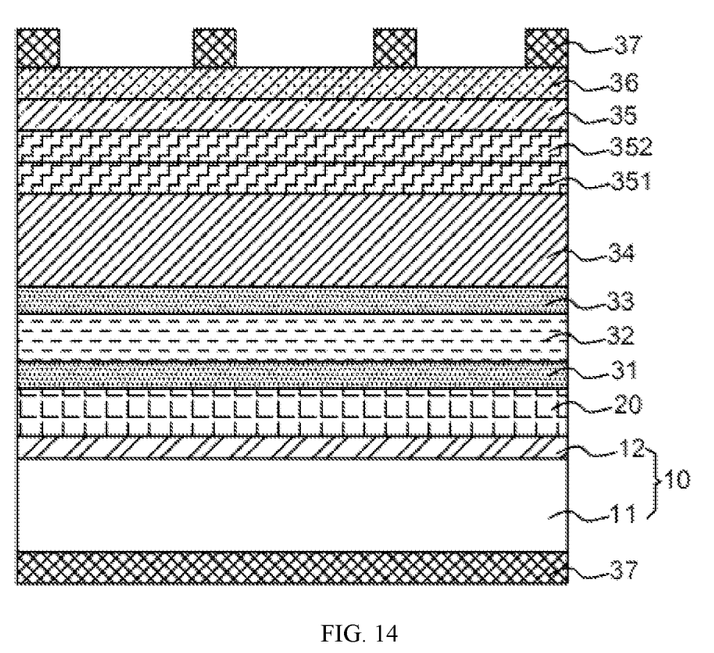

As shown in FIG. 14, an electrode 37 made of silver (with a thickness of 100 to 500 nm) is formed on the bottom cell 10 and the transparent conductive layer 36 by a silk screen printing or mask evaporation process.

In order to verify performance of the tandem cell according to the embodiments of the present disclosure, following description will be made by comparing embodiments with comparative embodiments.

Embodiment 1

A p-type crystalline silicon-perovskite tandem cell according to this embodiment includes a p-type crystalline silicon bottom cell, a tunneling recombination layer, a first ordered induction layer made of BPTT, a hole transport layer made of Cz2T, a second ordered induction layer made of lead bromide, a perovskite absorption layer, an electron transport interface layer, a current-leakage repair layer, an electron transport layer and a transparent conductive layer which are laminated in sequence.

A manufacturing method of the p-type crystalline silicon-perovskite tandem cell according to this embodiment is as follows.

In step 1, a p-type crystalline silicon wafer is provided. The p-type crystalline silicon wafer is polished, textured and cleaned in sequence to form the p-type crystalline silicon wafer with a textured surface.

In step 2, an n-type heavily doped layer is formed on a surface of the p-type crystalline silicon wafer with the textured surface by an ion implantation process.

In step 3, the tunneling recombination layer made of ITO is formed on a side (the bottom cell) of the p-type crystalline silicon wafer with a p-n junction by a magnetron sputtering process.

In step 4, the first ordered induction layer (with a thickness of 1 nm) made of BPTT was formed on the tunneling recombination layer by a thermal evaporation coating process.

In step 5, the hole transport layer (with a thickness of 5 nm) made of Cz2T is formed on the first ordered induction layer by a thermal evaporation coating process.

In step 6, the second ordered induction layer (with a thickness of 1 nm) made of lead bromide was formed on the hole transport layer by a magnetron sputtering process.

In step 7, the perovskite absorption layer is formed on the second ordered induction layer. This specifically includes following content.

Lead iodide and cesium bromide are formed on the second ordered induction layer by co-evaporation, with a rate of cesium bromide (CsBr) being 0.05 Å/s, a rate of lead iodide ($PbI_2$) being 0.1 Å/s, and a total thickness of 250 nm.

A mixed solution of formamidine hydroiodide (FAI) and formamidine hydrobromide (FABr) was coated on lead iodide and cesium bromide, and the mixed solution of FAI and FABr is reacted with lead iodide and cesium bromide so as to form a film of a perovskite material. A solvent of the mixed solution of FAI and FABr may be ethanol or isopropanol.

The film of the perovskite material is annealed for 30 minutes at a temperature of 100° C. to form the perovskite absorption layer. A material composition of the perovskite absorption layer is $Cs_xFA_{1-x}Pb(Br_yI_{1-y})_3$, and a thickness of the perovskite absorption layer may be 250 nm.

In step 8, the electron transport interface layer (with a thickness of 0.1 nm) made of LiF and a current-leakage repair layer (with a thickness of 1 nm) made of $C_{60}$ are formed on the perovskite absorption layer by a thermal evaporation process.

In step 9, the electron transport layer made of $SnO_2$ (with a thickness of 1 nm) is formed on the current-leakage repair layer by an atomic layer deposition process.

In step 10, the transparent conductive layer (with a thickness of 30 nm) made of IWO is formed on the electron transport layer by a magnetron sputtering process.

In step 11, a silver electrode (with a thickness of 100 nm) is formed on the bottom cell and the transparent conductive layer by silk screen printing.

Embodiment 2

A p-type crystalline silicon-perovskite tandem cell according to this embodiment includes a p-type crystalline silicon bottom cell, a tunneling recombination layer, a first ordered induction layer made of zinc oxide, a hole transport layer made of nickel oxide, a second ordered induction layer made of lead oxide, a perovskite absorption layer, an electron transport interface layer, a current-leakage repair layer, an electron transport layer and a transparent conductive layer which are laminated in sequence.

A manufacturing method of the p-type crystalline silicon-perovskite tandem cell according to this embodiment is as follows.

In step 1, a p-type crystalline silicon wafer is provided. The p-type crystalline silicon wafer is polished, textured and cleaned in sequence to form the p-type crystalline silicon wafer with a textured surface.

In step 2, an n-type heavily doped layer is formed on a surface of the p-type crystalline silicon wafer with the textured surface by an ion implantation process.

In step 3, the tunneling recombination layer made of FTO is formed on a side (the bottom cell) of the p-type crystalline silicon wafer with a p-n junction by a magnetron sputtering process.

In step 4, the first ordered induction layer (with a thickness of 20 nm) made of zinc oxide was formed on the tunneling recombination layer by a magnetron sputtering process.

In step 5, the hole transport layer (with a thickness of 100 nm) made of nickel oxide is formed on the first ordered induction layer by a magnetron sputtering process.

In step 6, the second ordered induction layer (with a thickness of 20 nm) made of lead oxide was formed on the hole transport layer by a magnetron sputtering process.

In step 7, the perovskite absorption layer is formed on the second ordered induction layer. This specifically includes following content.

Lead iodide and cesium bromide are formed on the second ordered induction layer by co-evaporation, with a rate of cesium bromide (CsBr) being 0.2 Å/s, a rate of lead iodide ($PbI_2$) being 10 Å/s, and a total thickness of 1000 nm.

A mixed solution of formamidine hydroiodide (FAI) and formamidine hydrobromide (FABr) was coated on lead iodide and cesium bromide, and the mixed solution of FAI and FABr is reacted with lead iodide and cesium bromide so as to form a film of a perovskite material. A solvent of the mixed solution of FAI and FABr may be ethanol or isopropanol.

The film of the perovskite material is annealed for 5 minutes at a temperature of 200° ° C. to form the perovskite absorption layer. A material composition of the perovskite absorption layer is $Cs_xFA_{1-x}Pb(Br_yI_{1-y})_3$, and a thickness of the perovskite absorption layer may be 1000 nm.

In step 8, the electron transport interface layer (with a thickness of 10 nm) made of LiF and a current-leakage repair layer (with a thickness of 20 nm) made of PCBM are formed on the perovskite absorption layer by a thermal evaporation process.

In step 9, the electron transport layer made of $SnO_2$ (with a thickness of 30 nm) is formed on the current-leakage repair layer by an atomic layer deposition process.

In step 10, the transparent conductive layer (with a thickness of 200 nm) made of IzO is formed on the electron transport layer by a magnetron sputtering process.

In step 11, a silver electrode (with a thickness of 500 nm) is formed on the bottom cell and the transparent conductive layer by silk screen printing.

Embodiment 3

A p-type crystalline silicon-perovskite tandem cell according to this embodiment includes a p-type crystalline silicon bottom cell, a tunneling recombination layer, a first ordered induction layer made of zinc oxide, a hole transport layer made of nickel oxide, a second ordered induction layer made of lead iodide, a perovskite absorption layer, an electron transport interface layer, a current-leakage repair layer, an electron transport layer and a transparent conductive layer which are laminated in sequence.

A manufacturing method of the p-type crystalline silicon-perovskite tandem cell according to this embodiment is as follows.

In step 1, a p-type crystalline silicon wafer is provided. The p-type crystalline silicon wafer is polished, textured and cleaned in sequence to form the p-type crystalline silicon wafer with a textured surface.

In step 2, an n-type heavily doped layer is formed on a surface of the p-type crystalline silicon wafer with the textured surface by an ion implantation process.

In step 3, the tunneling recombination layer made of ITO is formed on a side (the bottom cell) of the p-type crystalline silicon wafer with a p-n junction by a PECVD process.

In step 4, the first ordered induction layer (with a thickness of 8 nm) made of zinc oxide was formed on the tunneling recombination layer by a laser pulse deposition process.

In step 5, the hole transport layer (with a thickness of 60 nm) made of nickel oxide is formed on the first ordered induction layer by a magnetron sputtering process.

In step 6, the second ordered induction layer (with a thickness of 8 nm) made of lead iodide was formed on the hole transport layer by a laser pulse deposition process.

In step 7, the perovskite absorption layer is formed on the second ordered induction layer. This specifically includes following content.

Lead iodide and cesium bromide are formed on the second ordered induction layer by co-evaporation, with a rate of cesium bromide (CsBr) being 0.1 Å/s, a rate of lead iodide ($PbI_2$) being 3 Å/s, and a total thickness of 500 nm.

A mixed solution of formamidine hydroiodide (FAI) and formamidine hydrobromide (FABr) was coated on lead iodide and cesium bromide, and the mixed solution of FAI and FABr is reacted with lead iodide and cesium bromide so as to form a film of a perovskite material. A solvent of the mixed solution of FAI and FABr may be ethanol or isopropanol.

The film of the perovskite material is annealed for 20 minutes at a temperature of 120° ° C. to form the perovskite absorption layer. A material composition of the perovskite absorption layer is $Cs_xFA_{1-x}Pb(Br_yI_{1-y})_3$, and a thickness of the perovskite absorption layer may be 500 nm.

In step 8, the electron transport interface layer (with a thickness of 5 nm) made of LiF and a current-leakage repair layer (with a thickness of 10 nm) made of PCBM are formed on the perovskite absorption layer by a thermal evaporation process.

In step 9, the electron transport layer made of $SnO_2$ (with a thickness of 12 nm) is formed on the current-leakage repair layer by a chemical vapor deposition process.

In step 10, the transparent conductive layer (with a thickness of 50 nm) made of IZO is formed on the electron transport layer by a magnetron sputtering process.

In step 11, a silver electrode (with a thickness of 250 nm) is formed on the bottom cell and the transparent conductive layer by silk screen printing.

Embodiment 4

A p-type crystalline silicon-perovskite tandem cell according to this embodiment includes a p-type crystalline silicon bottom cell, a tunneling recombination layer, a first ordered induction layer made of BPTT, a hole transport layer made of copper phthalocyanine, a second ordered induction layer made of ammonium acetate, a perovskite absorption layer, an electron transport interface layer, a current-leakage repair layer, an electron transport layer and a transparent conductive layer which are laminated in sequence.

A manufacturing method of the p-type crystalline silicon-perovskite tandem cell according to this embodiment is as follows.

In step 1, a p-type crystalline silicon wafer is provided. The p-type crystalline silicon wafer is polished, textured and cleaned in sequence to form the p-type crystalline silicon wafer with a textured surface.

In step 2, an n-type heavily doped layer is formed on a surface of the p-type crystalline silicon wafer with the textured surface by an ion implantation process.

In step 3, the tunneling recombination layer made of AZO is formed on a side (the bottom cell) of the p-type crystalline silicon wafer with a p-n junction by a PECVD process.

In step 4, the first ordered induction layer (with a thickness of 16 nm) made of BPTT was formed on the tunneling recombination layer by a magnetron sputtering process.

In step 5, the hole transport layer (with a thickness of 80 nm) made of copper phthalocyanine is formed on the first ordered induction layer by a thermal evaporation coating process.

In step 6, the second ordered induced layer (with a thickness of 16 nm) made of ammonium acetate was formed on the hole transport layer by a laser pulse deposition process.

In step 7, the perovskite absorption layer is formed on the second ordered induction layer. This specifically includes following content.

Lead iodide and cesium bromide are formed on the second ordered induction layer by co-evaporation, with a rate of cesium bromide (CsBr) being 0.15 Å/s, a rate of lead iodide ($PbI_2$) being 7 Å/s, and a total thickness of 800 nm.

A mixed solution of formamidine hydroiodide (FAI) and formamidine hydrobromide (FABr) was coated on lead iodide and cesium bromide, and the mixed solution of FAI and FABr is reacted with lead iodide and cesium bromide so as to form a film of a perovskite material. A solvent of the mixed solution of FAI and FABr may be ethanol or isopropanol.

The film of the perovskite material is annealed for 20 minutes at a temperature of 180° ° C. to form the perovskite absorption layer. A material composition of the perovskite absorption layer is $Cs_xFA_{1-x}Pb(Br_yI_{1-y})_3$, and a thickness of the perovskite absorption layer may be 800 nm.

In step 8, the electron transport interface layer (with a thickness of 9 nm) made of LiF and a current-leakage repair layer (with a thickness of 18 nm) made of $C_{60}$ are formed on the perovskite absorption layer by a thermal evaporation process.

In step 9, the electron transport layer made of $SnO_2$ (with a thickness of 17 nm) is formed on the current-leakage repair layer by a physical vapor deposition process.

In step 10, the transparent conductive layer (with a thickness of 100 nm) made of ITO is formed on the electron transport layer by a magnetron sputtering process.

In step 11, a silver electrode (with a thickness of 300 nm) is formed on the bottom cell and the transparent conductive layer by silk screen printing.

Comparative Embodiment 1

A structure of a p-type crystalline silicon-perovskite tandem cell according to this comparative embodiment is basically the same as that of the tandem cell described in Embodiment 1, except that the first ordered induction layer made of BPTT and the second ordered induction layer made of lead bromide are omitted.

A manufacturing method of the p-type crystalline silicon-perovskite tandem cell according to this comparative embodiment is the same as that of Embodiment 1, which will not be repeatedly described here.

Comparative Embodiment 2

A structure of a p-type crystalline silicon-perovskite tandem cell according to this comparative embodiment is basically the same as that of the tandem cell described in Embodiment 1, except that the first ordered induction layer made of BPTT is omitted.

A manufacturing method of the p-type crystalline silicon-perovskite tandem cell according to this comparative embodiment is the same as that of Embodiment 1, which will not be repeatedly described here.

Comparative Embodiment 3

A structure of a p-type crystalline silicon-perovskite tandem cell according to this comparative embodiment is basically the same as that of the tandem cell described in Embodiment 1, except that the second ordered induction layer made of lead bromide are omitted.

A manufacturing method of the p-type crystalline silicon-perovskite tandem cell according to this comparative embodiment is the same as that of Embodiment 1, which will not be repeatedly described here.

To verify performance of the tandem cell, photoelectric conversion efficiency, filling factor (FF), open circuit voltage ($V_{OC}$), short circuit current ($J_{SC}$) and other performance parameters of devices prepared in Embodiments 1 to 4 and Comparative Embodiments 1 to 3 were tested. See Table 1 for comparison of performance parameters.

TABLE 1

Comparison table of performance parameters of different tandem cells

| Number | Effective Area (cm$^2$) | Voc (V) | Jsc (mA/cm$^2$) | FF | Photoelectric Conversion Efficiency |
|---|---|---|---|---|---|
| Embodiment 1 | 1.21 | 1.64 | 19.9 | 0.75 | 24.5% |
| Embodiment 2 | 1.21 | 1.65 | 19.7 | 0.74 | 24.0% |
| Embodiment 3 | 1.21 | 1.62 | 19.3 | 0.78 | 24.4% |
| Embodiment 4 | 1.21 | 1.69 | 20.2 | 0.77 | 26.3% |
| Comparative Embodiment 1 | 1.21 | 1.61 | 19.7 | 0.72 | 22.8% |
| Comparative Embodiment 2 | 1.21 | 1.63 | 19.8 | 0.73 | 22.9% |
| Comparative Embodiment 3 | 1.21 | 1.62 | 19.7 | 0.73 | 22.9% |

It may be seen from the above embodiments, comparative embodiments and Table 1 that the photoelectric conversion efficiency of the tandem cell with the first ordered induction layer or the second ordered induction layer is improved, and the photoelectric conversion efficiency of the tandem cell with both the first ordered induction layer and the second ordered induction layer is greatly improved, for which a driving force mainly originates from increase of the filling factor (FF) and the open circuit voltage (Voc). It may be seen that provision of the first ordered induction layer and the second ordered induction layer may improve crystallization performance of the hole transport layer and perovskite absorption layer, facilitate separation and transmission of photo-generated carriers, and reduce accumulation and recombination of electrons and holes in the tandem cell.

In description of above embodiments, specific features, structures, materials or characteristics may be combined in any one or more of embodiments or examples in a suitable manner.

The above is only specific embodiments of the present disclosure, but a protection scope of the present disclosure is not limited to this, and any change or substitution which occurs to any person familiar with this technical field within the technical scope disclosed by the present disclosure should be encompassed within the protection scope of the present disclosure. Therefore, protection scope of the present disclosure shall be subject to a protection scope of the claims.

The invention claimed is:

1. A tandem cell, comprising:
   a bottom cell with a textured surface; and
   a perovskite top cell on the bottom cell;
   wherein a hole transport layer of the perovskite top cell is formed on the textured surface of the bottom cell;
   a perovskite absorption layer is formed on the hole transport layer of the perovskite top cell;
   a transparent conductive layer is formed on the perovskite absorption layer;
   the tandem cell further comprises a first ordered induction layer, the first ordered induction layer being located between the textured surface of the bottom cell and the hole transport layer, wherein a thickness of the first ordered induction layer is 1 nm to 20 nm; and
   an inducing material contained in the first ordered induction layer is dibenzothiophene, and the hole transport layer is made of an organic hole-transport material.

2. The tandem cell according to claim 1, wherein the hole transport layer is made of one or more of Poly[bis(4-phenyl)(2,4,6-triMethylphenyl)aMine], 2,2',7,7'-Tetrakis[N,N-di(4-methoxyphenyl)amino]-9,9'-spirobifluorene, 2,2',7,7'-tetra(N, N-di-tolyl)aMino-spiro-bifluor, and copper phthalocyanine.

3. The tandem cell according to claim 1, wherein a thickness of the hole transport layer is 5 nm to 100 nm.

4. The tandem cell according to claim 1, wherein a general chemical formula of the perovskite material is $ABX_3$, wherein A is one or more of $CH_3NH_3$ cation, $C_4H_9NH_3$ cation, $NH_2=CHNH_2$ cation and Cs cation; B is one or two of $Pb^{2+}$ and $Sn^{2+}$; and X is one or more of $Cl^-$, $Br^-$ and $I^-$.

5. The tandem cell according to claim 1, further comprising:
   a second ordered induction layer formed on the hole transport layer;
   wherein the perovskite absorption layer of the perovskite top cell is formed on the second ordered induction layer; and an inducing material contained in the second ordered induction layer is organic ammonium salt or inorganic lead compound.

6. The tandem cell according to claim 5, wherein a process of forming the second ordered induction layer and the hole transport layer is a magnetron sputtering process, a laser pulse deposition process, a thermal evaporation coating process, a chemical vapor deposition process, a solution coating process, a gel-sol process or a nanoparticle hydrothermal synthesis process.

7. The tandem cell according to claim 5, wherein the method of forming the perovskite absorption layer comprises:
forming lead iodide and cesium bromide on the second ordered induction layer by co-evaporation,
coating a mixed solution of formamidine hydroiodide and formamidine hydrobromide on lead iodide and cesium bromide to form a perovskite material film; and
annealing the perovskite thin film to form the perovskite absorption layer.

8. The tandem cell according to claim 5, wherein a thickness of the second ordered induction layer is 1 nm to 20 nm.

9. The tandem cell according to claim 8, wherein the hole transport layer is made of one or more of Poly[bis(4-phenyl)(2,4,6-triMethylphenyl)aMine], 2,2',7,7'-Tetrakis[N,N-di(4-methoxyphenyl)amino]-9,9'-spirobifluorene, 2,2',7,7'-tetra(N, N-di-tolyl)aMino-spiro-bifluor, and copper phthalocyanine.

10. The tandem cell according to claim 8, wherein a thickness of the hole transport layer is 5 nm to 100 nm.

11. The tandem cell according to claim 8, wherein a process of forming the second ordered induction layer and the hole transport layer is a magnetron sputtering process, a laser pulse deposition process, a thermal evaporation coating process, a chemical vapor deposition process, a solution coating process, a gel-sol process or a nanoparticle hydrothermal synthesis process.

12. The tandem cell according to claim 8, wherein a general chemical formula of the perovskite material is $ABX_3$, wherein A is one or more of $CH_3NH_3$ cation, $C_4H_9NH_3$ cation, $NH_2=CHNH_2$ cation and Cs cation; B is one or two of $Pb^{2+}$ and $Sn^{2+}$; and X is one or more of $Cl^-$, $Br^-$ and $I^-$.

13. The tandem cell according to claim 5, wherein the inorganic lead compound is one or more of lead oxide, lead bromide, lead iodide, lead chloride, lead acetate, lead thiocyanate and lead sulfide.

14. The tandem cell according to claim 13, wherein the hole transport layer is made of one or more of Poly[bis(4-phenyl)(2,4,6-triMethylphenyl)aMine], 2,2',7,7'-Tetrakis[N,N-di(4-methoxyphenyl)amino]-9,9'-spirobifluorene, 2,2',7,7'-tetra(N, N-di-tolyl)aMino-spiro-bifluor, and copper phthalocyanine.

15. The tandem cell according to claim 13, wherein a thickness of the hole transport layer is 5 nm to 100 nm.

16. The tandem cell according to claim 13, wherein a process of forming the second ordered induction layer and the hole transport layer is a magnetron sputtering process, a laser pulse deposition process, a thermal evaporation coating process, a chemical vapor deposition process, a solution coating process, a gel-sol process or a nanoparticle hydrothermal synthesis process.

17. The tandem cell according to claim 13, wherein a general chemical formula of the perovskite material is $ABX_3$, wherein A is one or more of $CH_3NH_3$ cation, $C_4H_9NH_3$ cation, $NH_2=CHNH_2$ cation and Cs cation; B is one or two of $Pb^{2+}$ and $Sn^{2+}$; and X is one or more of $Cl^-$, $Br^-$ and $I^-$.

18. The tandem cell according to claim 13, wherein the method of forming the perovskite absorption layer comprises:
forming lead iodide and cesium bromide on the second ordered induction layer by co-evaporation,
coating a mixed solution of formamidine hydroiodide and formamidine hydrobromide on lead iodide and cesium bromide to form a perovskite material film; and
annealing the perovskite thin film to form the perovskite absorption layer.

* * * * *